United States Patent
Wu et al.

(10) Patent No.: US 6,406,974 B1
(45) Date of Patent: Jun. 18, 2002

(54) METHOD OF FORMING TRIPLE N WELL UTILIZING PHOSPHORUS AND BORON ION IMPLANTATIONS

(75) Inventors: Der-Yuan Wu, Hsinchu; Jhy-Jeng Liu, Taipei Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/535,497

(22) Filed: Mar. 24, 2000

(51) Int. Cl.$^7$ .................. H01L 21/761; H01L 21/426
(52) U.S. Cl. .................. 438/420; 438/527; 438/529
(58) Field of Search ................. 438/420, 414, 438/514, 527, 529

(56) References Cited

U.S. PATENT DOCUMENTS

| | | | |
|---|---|---|---|
| 5,397,734 A | * | 3/1995 | Iguchi et al. |
| 5,814,866 A | * | 9/1998 | Borland |
| 5,880,014 A | * | 3/1999 | Park et al. |
| 5,943,595 A | * | 8/1999 | Akiyama et al. |
| 6,010,926 A | * | 1/2000 | Rho et al. |
| 6,097,078 A | * | 8/2000 | Sim et al. |
| 6,309,921 B1 | * | 10/2001 | Ema et al. .................. 438/228 |

OTHER PUBLICATIONS

Stanley Wolf and Richard N. Tauber, "Silicon Processing for the VLSI Era, vol. 1: Process Technology," Lattice Press, Sunset Beach, California (1986), pp. 308–321.*

* cited by examiner

Primary Examiner—Keith Christianson
Assistant Examiner—Stephen W. Smoot
(74) Attorney, Agent, or Firm—J.C. Patents

(57) ABSTRACT

A method of forming a triple N well is described. A first pattern mask layer is formed on a substrate. A first ion implantation step is performed to form an annular longitudinal deep N well in the substrate. A second ion implantation step is performed to form an annular longitudinal shallow N well in the substrate. The annular longitudinal shallow N well lies above the annular longitudinal deep N well. The first mask layer is removed. A second patterned mask layer is formed on the substrate. A third ion implantation step is performed to form a transversal deep N well surrounded by the annular longitudinal deep N well. The transversal deep N well is connected with the annular longitudinal deep N well. Thus a triple N well is formed. A fourth ion implantation step is performed to form a cell well surrounded by the annular longitudinal deep N well. The cell well lies above the transversal deep N well. The second mask layer is removed.

16 Claims, 4 Drawing Sheets

METHOD OF FORMING TRIPLE N WELL UTILIZING PHOSPHORUS AND BORON ION IMPLANTATIONS

BACKGROUND OF THE INVENTION

1. Field of Invention

The present invention relates to a method of forming a semiconductor device. More particularly, the present invention relates to a method of forming a triple N well.

2. Description of Related Art

As the increasing integration of a wafer, a parasitic photodiode loop is easily formed between a P-type transistor and an N-type transistor, leading to a latch-up effect and an increase of minority carrier injection into the transistor. The device performance is hence affected because of the above-mentioned phenomenon. In order to avoid the above-mentioned phenomenon, a conventional resolution is to complicate the design layout of the semiconductor devices to avoid the area which the latch-up and the minority carrier injection may occur. However, this method decreases performance of wafers. Therefore, a triple N well structure is developed to solve the above-mentioned problems and to simplify the design layout of the semiconductor devices.

FIG. 1 is a schematic, cross-sectional view showing a conventional triple N well structure. As shown in FIG. 1, a cell well 112 of P type is embedded in a substrate 100. The cell well 112 is surrounded by an annular shallow N well 110. From the cross-sectional view, the annular shallow N well 110 lies beside the cell well 112. A deep N well 108 lies below the cell well 12 and the annular shallow N well 110. Therefore, from the cross-sectional view, the cell well 112 is surrounded with a triple N well composed of the annular shallow N well 110 and the deep N well 108. Commonly, an N type transistor (not shown) is formed on the cell well 112. Additionally, an N well 113 adjacent to the triple well is formed in the substrate 100. Typically, a P type transistor (not shown) is formed on the N well 113.

The above-mentioned triple N well can efficiently isolate the transistor on the cell well from other devices on the other N well to avoid occurrence of minority carrier injection and mutual disturbance between these devices and to simplify the design layout of the semiconductor devices.

SUMMARY OF THE INVENTION

Accordingly, the invention provides a method of forming a triple N well. The method needs only two masks to form a triple N well. Thus manufacturing time and cost can be greatly reduced and the same insulating effect can be obtained as a conventional method.

As embodied and broadly described herein, the invention provides a method of forming a triple N well. A first pattern mask layer is formed on a substrate. A first ion implantation step is performed to form an annular longitudinal deep N well in the substrate. A second ion implantation step is performed to form an annular longitudinal shallow N well in the substrate. The annular longitudinal shallow N well lies above the annular longitudinal deep N well. The first mask layer is removed. A second patterned mask layer is formed on the substrate. A third ion implantation step is performed to form a transversal deep N well surrounded by the annular longitudinal deep N well. The transversal deep N well is connected with the annular longitudinal deep N well. A fourth ion implantation step is performed to form a cell well surrounded by the triple N well. The cell well lies above the transversal deep N well. The second mask layer is removed.

Accordingly, the invention provides a method of forming a semiconductor device. A first pattern mask layer is formed on a substrate. A first ion implantation step is performed to form an annular longitudinal deep N well and a retrograde barrier well in the substrate. A second ion implantation step is performed to form an annular longitudinal shallow N well and an N well in the substrate. The annular longitudinal shallow N well lies above the annular longitudinal deep N well. The N well lies above the retrograde barrier well. The first mask layer is removed. A second patterned mask layer is formed on the substrate. A third ion implantation step is performed to form a transversal deep N well surrounded by the annular longitudinal deep N well. The transversal deep N well is connected with the annular longitudinal deep N well. A fourth ion implantation step is performed to form a cell well surrounded by the triple N well. The cell well lies above the transversal deep N well. The second mask layer is removed.

The invention can use the same mask to continuously perform ion implantation steps by controlling dosage and energy of dopants so as to form a N type well or a P type well with different depths in the substrate. The invention needs only two mask layers, thus, manufacturing time and cost can be reduced.

It is to be understood that both the foregoing general description and the following detailed description are exemplary, and are intended to provide further explanation of the invention as claimed.

DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A–2E are schematic, cross-sectional views showing a triple N well structure according to one preferred embodiment of this invention.

Figure 1:
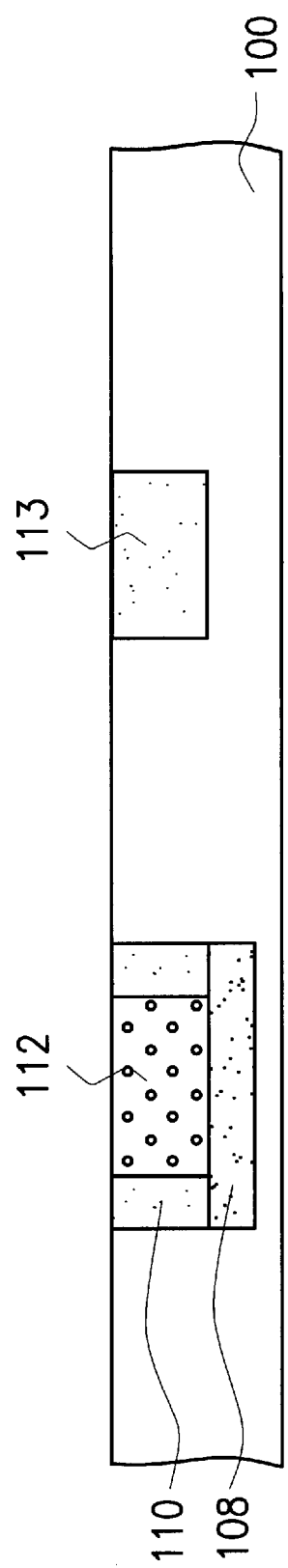
FIG. 1 is a schematic, cross-sectional view showing a conventional triple N well structure.
Figure 2A:
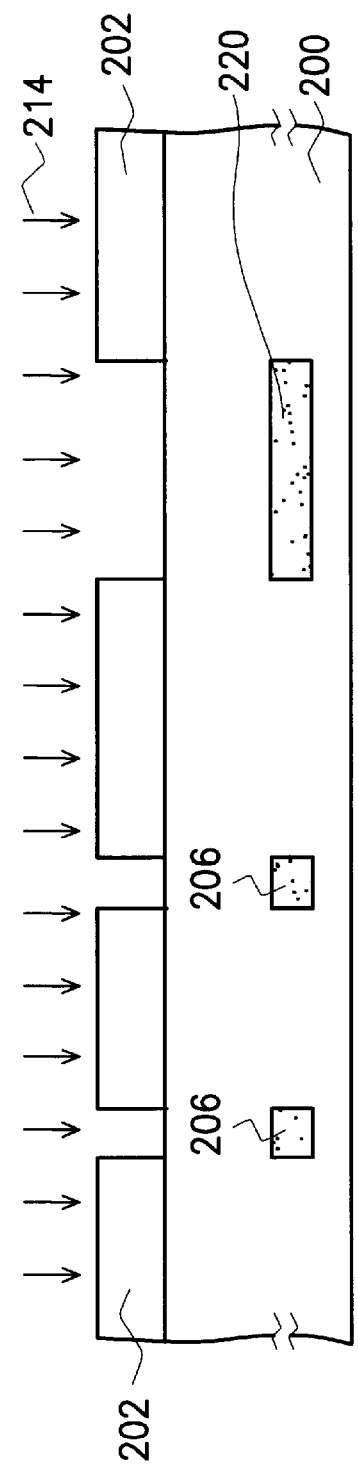
FIGS. 2A–2E are schematic, cross-sectional views showing a triple N well structure according to one preferred embodiment of this invention.

Referring to FIG. 2A, a first patterned mask layer 202 such as a photoresist layer is formed over a substrate 200. The first patterned mask layer 202 is formed by, for example, a conventional photolithography technology. A first ion implantation 214 is performed to form an annular longitudinal deep N well 206 and a retrograde barrier well 220. The first ion implantation operation 214 is performed by, for example, a mega ev implanter. The implantation can be carried out using phosphorous ions with an energy level of about 950 KeV and a dosage level of about $2.0 \times 10^{13}/cm^2$.

Figure 2B:
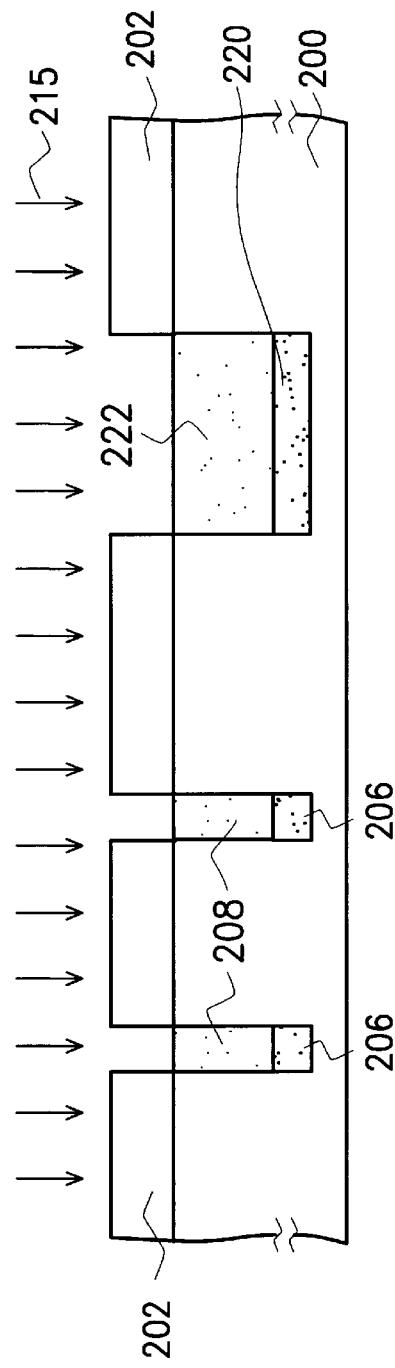

Referring to FIG. 2B, a second ion implantation 215 is performed using the same first patterned mask layer 202 as a mask to form an annular longitudinal shallow N well 208 and an N well 222 in the substrate 200. The annular longitudinal shallow N well 208 lies above the annular longitudinal deep N well 206. The N well 222 lies above the retrograded barrier well 220. The retrograded barrier well 220 serves as electron barrier of the N well 222. A second ion implantation 215 is performed by, for example, a mega ev implanter. The second implantation step can be carried out using phosphorous ions with an energy level of about 300 KeV and a dosage level of about $1.0 \times 10^{13}/cm^2$. The concentration implanted in the retrograded barrier well 220 is sufficient high so as to efficiently prevent the N well 222 from the minority carrier injection. Thus the retrograded barrier well 220 provide a strong barrier for the N well 222 to prevent p type transistor formed on the N well from carrier injection, leading to the disturbance of P type transistor performance.

Figure 2C:
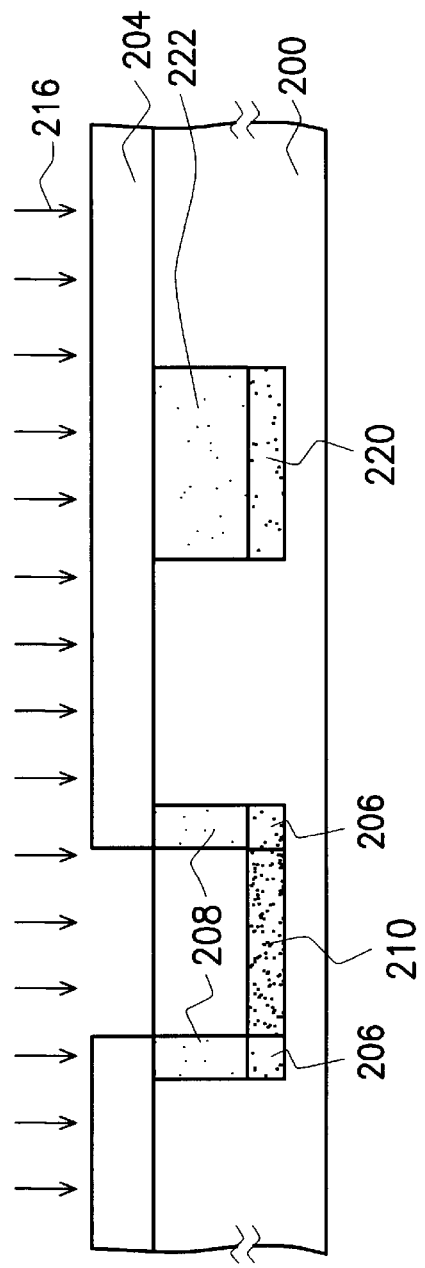

Referring to FIG. 2C, the first mask layer 202 is removed. A second patterned mask layer 204 is formed on the substrate 200. A third ion implantation 216 is performed using the second patterned mask layer 204 as a mask to form a transversal deep N well 210 between the annular deep N well 206. The transversal deep N well 210 is connected with the annular longitudinal deep N well 206. The longitudinal deep N well 206 and the annular transversal deep N well 210 compose a deep N well. Thus a triple N well is composed of the annular longitudinal shallow N well 208, the annular longitudinal deep N well 206 and the transversal deep N well 210. The operating condition of the third ion implantation step 216 is the same as that of the first ion implantation step 214. The third ion implantation 216 is performed by, for example, a mega ev implanter. The third implantation step can be carried out using phosphorous ions with an energy level of about 950 KeV and a dosage level of about $2.0 \times 10^{13}/cm^2$.

Figure 2D:
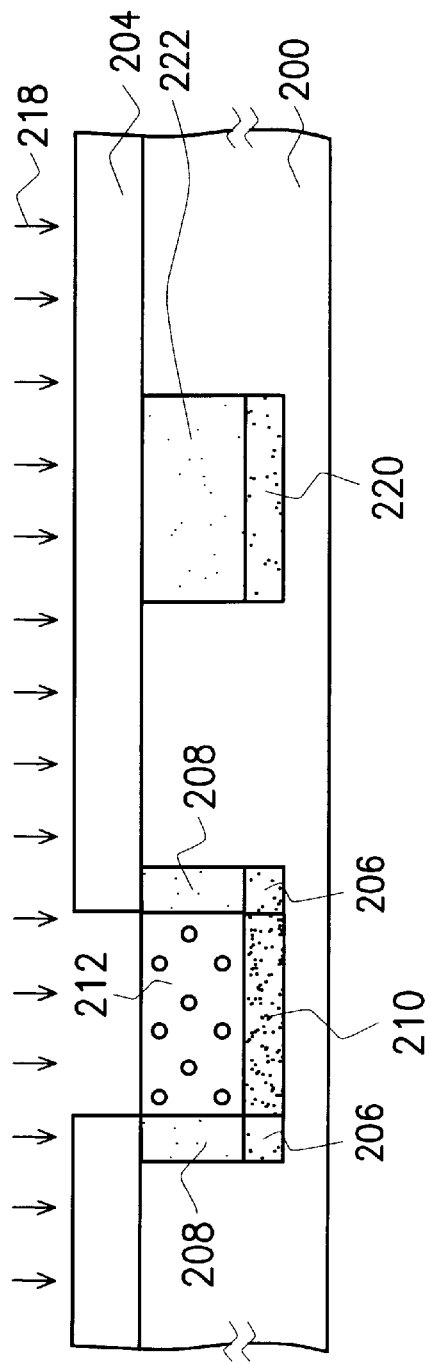

Referring to FIG. 2D, a fourth ion implantation 218 is performed using the second mask layer 204 as a mask to form a cell well 212 surrounded by the annular longitudinal shallow N well 208. The cell well 212 lies above the transversal deep N well 210. The fourth ion implantation 218 is performed by, for example, a mega ev implanter. The fourth implantation step 218 can be carried out using boron ions with an energy level of about 80 KeV and a dosage level of about $1.5 \times 10^{13}$ to about $2.0 \times 10^{13}/cm^2$.

Figure 2E:
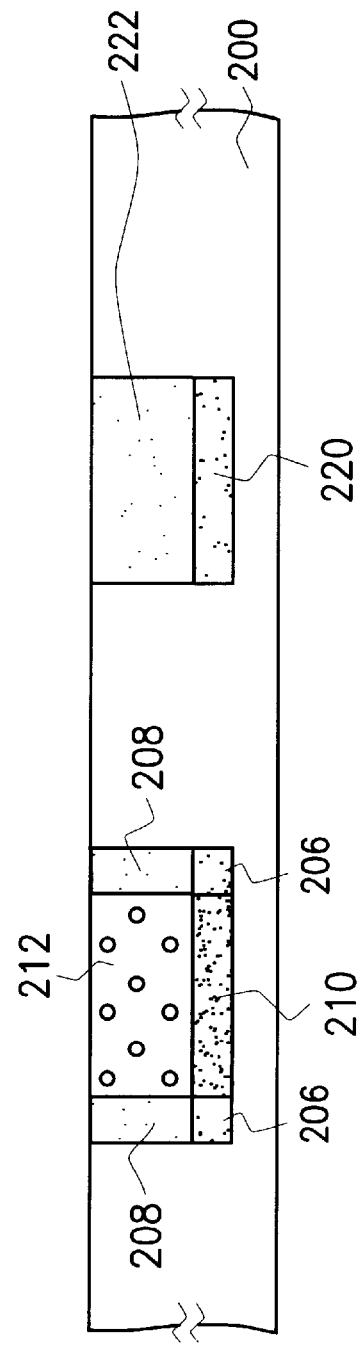

Referring to FIG. 2E, after the transversal deep n well 210 and the cell well 212 are formed, the second mask layer 204 is removed. An N type transistor (not shown) is formed on the cell well 212, and a P type transistor (not shown) is formed on the N well 222. The forming methods of the N type transistor and the P type transistor are understood by persons skilled in the art, hence the description is omitted here.

Figure 3:
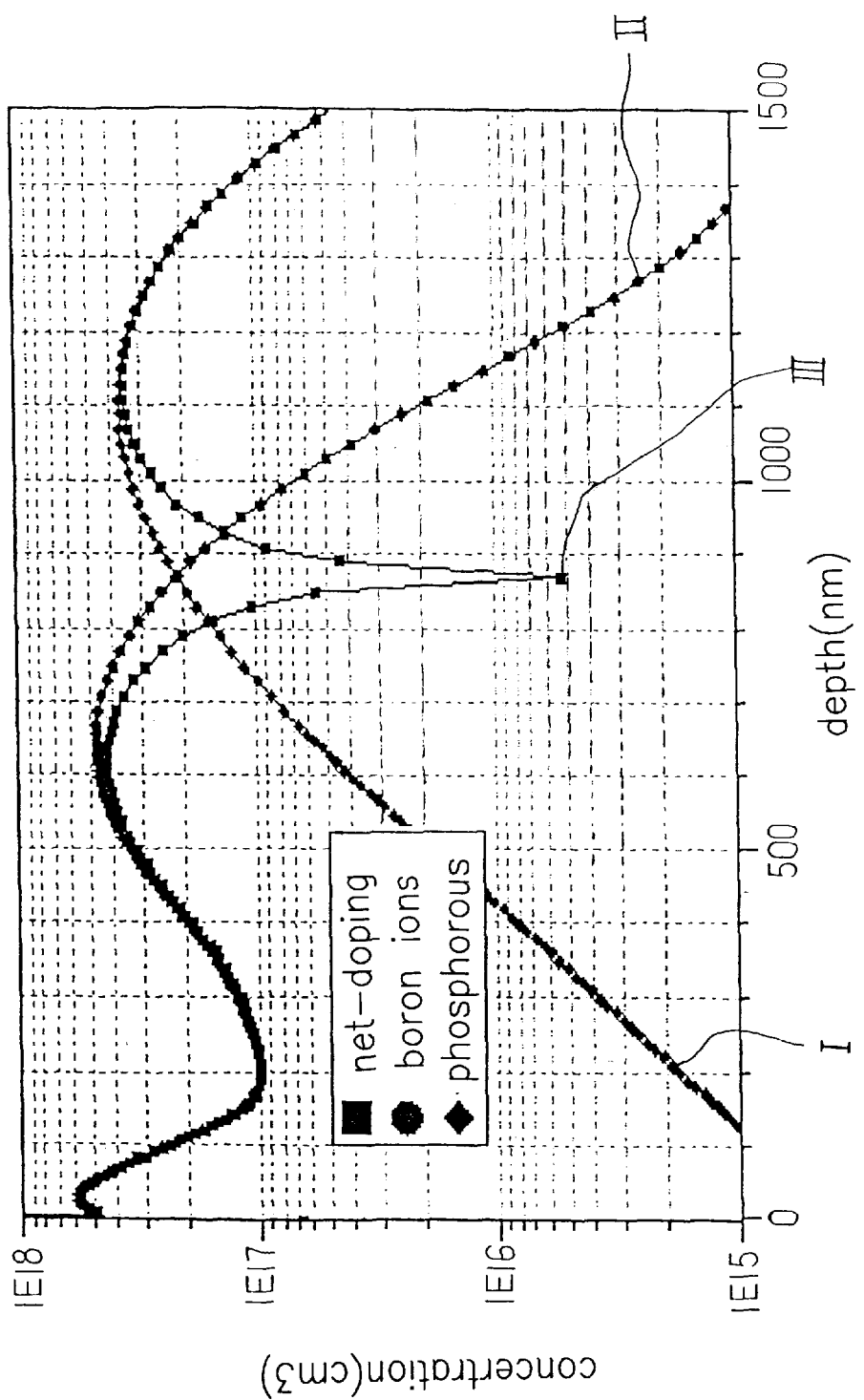
FIG. 3 shows concentration of phosphorous ions and boron ions at different implanted depth.

FIG. 3 shows the relation between concentration of phosphorous ions and boron ions and their implanted depth. This is just an example, and the concentration and the implanted depth can be determined by the requirement of designers. To see concentration curve (I) of phosphorous ions in FIG. 3, the concentration of the phosphorous ions is quite low when their implanted depth is 110 nm. As the implanted depth increases, the concentration of the phosphorous ions also increases to a maximum value. Then when the implanted depth increases to 1500 nm, the concentration of the phosphorous ions slightly decreases. At this time the concentration of the boron ions approaches zero. In the other hand, concentration curve (II) of boron ions is approximately reverse to the concentration curve (I) of phosphorous ions. That is, the concentration of the phosphorous ions is far larger than the concentration of the boron ions when the implanted depth is larger, and the concentration of the boron ions is far larger than the concentration of the phosphorous ions when the implanted depth is smaller. The concentration of the phosphorous ions is almost the same as the concentration of the boron ions when the implanted depth is about 870 nm. According to the concentration of the phosphorous ions and the boron ions and the implanted depth, a net-doping curve can be obtained. In the range of 870–1500 nm, the concentration of the phosphorous ions is far larger than the concentration of the boron ions. Therefore, sufficient N type dopant can be provided to make the silicon substrate in this range form N type silicon. This is where the deep N well is located. In the range of 0–870 nm, the concentration of the boron ions is far larger than the concentration of the phosphorous ions. Therefore, sufficient P type dopant can be provided to make the silicon substrate in this range form P type silicon. This is where the cell well is located.

According to the net-doping curve (III), when the depth is about 870 nm, that is the interface between the cell well and the deep N well, the net-doping concentration is lowered to the minimum value. Since the concentrations of the phosphorous ions and the boron ions are almost the same, semiconductor devices at the interface approaches neutrality. The invention performs the implantation of phosphorous ions and boron ions using the same mask layer by controlling the dosage and the energy of the phosphorous ions and the boron ions to form the deep N well and the cell well.

Furthermore, the invention can control the quality of the transversal deep N well and the cell well at the interface to approach neutrality. Moreover, the dopant concentration at the interface is quite low so as to prevent the cell well from effect of the transversal deep N well, leading to the disturbance on electricity.

Accordingly, advantages of the invention are as follows:

(1) In the invention, only two mask layers are required to form a triple N well. Therefore, manufacturing time and cost can be greatly reduced.

(2) The invention can accurately control concentration and implanted depth of the transversal deep N well so as to assure the insulating result of the triple N well. Moreover, the invention can prevent the cell well from the disturbance of the transversal deep N well.

(3) During fabrication of the triple N well, a retrograde barrier well is formed below the N well. The retrograde barrier well can be used as an electron barrier layer for the P type transistor to avoid carrier injection and disturbance of the P type transistor performance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a triple N well, comprising:
   providing a substrate having a first patterned mask layer formed thereon;
   performing a first ion implantation step to form an annular longitudinal deep N well in the substrate, wherein the first ion implantation step is performed with phosphorus ions implanted with an energy level of about 950 KeV;
   performing a second ion implantation step to form an annular longitudinal shallow N well in the substrate, the annular longitudinal shallow N well lying above the annular longitudinal deep N well, wherein the second ion implantation step is performed with phosphorus ions implanted with an energy level of about 300 KeV;

removing the first patterned mask layer;

forming a second patterned mask layer on the substrate;

performing a third ion implantation step to form a transversal deep N well surrounded by the annular longitudinal deep N well, the transversal deep N well being connected with the annular longitudinal deep N well to form the triple N well, wherein the third implantation step is performed with phosphorus ions implanted with an energy level of about 950 KeV;

performing a fourth ion implantation step to form a cell well surrounded by the triple N well, the cell well lying above the transversal deep N well, wherein the fourth ion implantation step is performed with boron ions implanted with an energy level of about 80 KeV so that an interface between the transversal deep N well and the cell well substantially approaches neutrality while the dopant concentration at the interface is substantially low; and removing the second patterned mask layer.

2. The method of claim 1, wherein the first ion implantation and the third ion implantation are performed by a mega ev implanter.

3. The method of claim 1, wherein the second and the fourth ion implantation steps are performed by a mega ev implanter.

4. The method of claim 1, wherein the first and the third implantation steps are performed with a dosage level of about $2.0 \times 10^{13}/cm^2$.

5. The method of claim 1, wherein the second implantation step is performed with a dosage level of about $1.0 \times 10^{13}/cm^2$.

6. The method of claim 1, wherein the fourth implantation step is performed with a dosage level of about $1.5 \times 10^{13}$ to about $2.0 \times 10^{13}/cm^2$.

7. The method of claim 1, wherein the depth of the annular longitudinal deep N well and the annular transversal deep N well in the substrate is in the range of 870–1500 nm.

8. The method of claim 1, wherein the depth of the cell well in the substrate is in the range of 0–870 nm.

9. A method of forming a triple N well in a semiconductor device, comprising:

providing a substrate having a first patterned mask layer formed thereon;

performing a first ion implantation step to form an annular longitudinal deep N well and a retrograde barrier well in the substrate, wherein the first ion implantation step is performed with phosphorus ions implanted with an energy level of about 950 KeV;

performing a second ion implantation step to form an annular longitudinal shallow N well and a N well in the substrate, the annular longitudinal shallow N well lying above the annular longitudinal deep N well, the N well lying above the retrograde barrier well, wherein the second ion implantation step is performed with phosphorus ions implanted with an energy level of about 300 KeV;

removing the first patterned mask layer;

forming a second patterned mask layer on the substrate;

performing a third ion implantation step to form a transversal deep N well surrounded by the annular longitudinal deep N well, the transversal deep N well being connected with the annular longitudinal deep N well to form the triple N well, wherein the third implantation step is performed with phosphorus ions implanted with an energy level of about 950 KeV;

performing a fourth ion implantation step to form a cell well surrounded by the triple N well, the cell well lying above the transversal deep N well, wherein the fourth ion implantation step is performed with boron ions implanted with an energy level of about 80 KeV so that an interface between the transversal deep N well and the cell well substantially approaches neutrality while the dopant concentration is substantially low; and removing the second patterned mask layer.

10. The method of claim 9, wherein the first ion implantation and the third ion implantation are performed by a mega ev implanter.

11. The method of claim 9, wherein the second and the fourth ion implantation steps are performed by a mega ev implanter.

12. The method of claim 9, wherein the first and the third implantation steps are performed with a dosage level of about $2.0 \times 10^{13}/cm^2$.

13. The method of claim 9, wherein the second implantation step is performed with a dosage level of about $1.0 \times 10^{13}/cm^2$.

14. The method of claim 9, wherein the fourth implantation step is performed with a dosage level of about $1.5 \times 10^{13}$ to about $2.0 \times 10^{13}/cm^2$.

15. The method of claim 9, wherein the depth of the annular longitudinal deep N well and the annular transversal deep N well in the substrate is in the range of 870–1500 nm.

16. The method of claim 9, wherein the depth of the cell well in the substrate is in the range of 0–870 nm.

* * * * *